United States Patent [19]

Tanaka et al.

[11] Patent Number: 5,571,777
[45] Date of Patent: Nov. 5, 1996

[54] SUPERCONDUCTING THIN FILM HAVING AT LEAST ONE ISOLATED SUPERCONDUCTING REGION FORMED OF OXIDE SUPERCONDUCTOR MATERIAL AND METHOD FOR MANUFACTURING THE SAME

[75] Inventors: So Tanaka; Michitomo Iiyama, both of Osaka, Japan

[73] Assignee: Sumitomo Electric Industries, Ltd., Osaka, Japan

[21] Appl. No.: 479,853

[22] Filed: Jun. 7, 1995

Related U.S. Application Data

[63] Continuation of Ser. No. 136,613, Oct. 15, 1993, abandoned, which is a continuation of Ser. No. 849,491, Mar. 11, 1992, abandoned.

[30] Foreign Application Priority Data

Mar. 11, 1991 [JP] Japan ................................. 3-70671
Mar. 11, 1991 [JP] Japan ................................. 3-70672

[51] Int. Cl.$^6$ ................................................ B32B 9/00
[52] U.S. Cl. .................... 505/237; 505/701; 505/235; 505/239; 428/688; 428/701
[58] Field of Search .................................. 428/688, 210, 428/209, 689, 701, 702, 930; 505/235, 237, 238, 239, 701, 703, 741

[56] References Cited

U.S. PATENT DOCUMENTS

| | | | |
|---|---|---|---|
| 5,001,108 | 3/1991 | Taguchi | 505/1 |
| 5,071,832 | 12/1991 | Iwanatsu | 505/1 |
| 5,079,216 | 1/1992 | Henty | 505/1 |
| 5,084,438 | 1/1992 | Matsbara et al. | 505/1 |
| 5,096,878 | 3/1992 | Hoshino | 505/741 |
| 5,135,908 | 8/1992 | Yang et al. | 505/703 |

FOREIGN PATENT DOCUMENTS

| | | |
|---|---|---|
| 410374 | 7/1991 | European Pat. Off. |
| 63-164037 | 7/1988 | Japan |
| 0258082 | 10/1988 | Japan ........ 505/703 |
| 2000390 | 1/1990 | Japan ........ 505/702 |
| 2042787 | 2/1990 | Japan ........ 505/701 |

OTHER PUBLICATIONS

Doss, Engineers Guide to High Tc Superconductivity, 1989 pp. 102–109.
Sahu et al., in "Chemistry of High T. Super II," ACS 1988 pp. 1–11.
Wolf, Silicon Processing for the VLSI Era, vol. 2, Lattice Press (1990), p. 65.
"Superconductors Material Problems" Science vol. 240, Apr. 1, 1988, pp. 25–26.
Hirata, et al., Appl. Phys. Lett. vol. 56, No. 7 Feb. 12, 1990, pp. 683–685.
Fork D. K., et al, "Reaction Patterning of YBa2Cu2O7–d Thin Films", *Applied Physics Letters*, vol. 57, No. 23, 3 Dec. 1990, New York, U.S., pp. 2504–2506.
Fork D. K., et al, "Buffer Layers for High Quality Epitaxial YBCO Films on Si", *IEEE Transactions on Applied Superconductivity*, vol. 1. No. 1, Mar. 1991, New York, U.S., pp. 67–73.
Ma, Q. Y. et al, "Novel Method of Patterning YBaCuO Superconducting Films", *Applied Physics Letters*, vol. 55, No. 9, 28 Aug. 1989, New York, U.S., pp. 896–890.
Hatano T. et al, "Unique Method of Patterning Superconducting Thin Films by Selective Growth of Y–Ba–Cu–O", *Japanese Journal of Applied Physics*, vol. 29, No. 6, Jun. 1990, Tokyo, Japan, pp. 1076–1079.

*Primary Examiner*—Patrick Ryan
*Assistant Examiner*—Patrick Jewik
*Attorney, Agent, or Firm*—Beveridge, DeGrandi, Weilacher & Young, L.L.P.

[57] ABSTRACT

A superconducting thin film formed on a semiconductor substrate, which comprises at least one superconducting region formed of an oxide superconductor on the principal surface of the semiconductor substrate and at least one isolation region formed of an oxide insulator including component atoms of the oxide superconductor, which surrounds the superconducting region, and the superconductor thin film has a planar upper surface.

10 Claims, 3 Drawing Sheets

5,571,777

SUPERCONDUCTING THIN FILM HAVING AT LEAST ONE ISOLATED SUPERCONDUCTING REGION FORMED OF OXIDE SUPERCONDUCTOR MATERIAL AND METHOD FOR MANUFACTURING THE SAME

This application is a continuation of application Ser. No. 08/136,613, filed Oct. 15, 1993, abandoned, which application is entirely incorporated herein by reference, and which is a continuation of application Ser. No. 07/849,491, filed Mar. 11, 1992, now abandoned.

BACKGROUND OF THE INVENTION

1. Field of the invention

The present invention relates to a superconducting thin film and a method for manufacturing the same, and more specifically to a superconducting thin film having at least an isolated superconducting region formed of oxide an material, and a method for manufacturing the same.

2. Description of Related Art

Elemental devices which utilize superconductivity operate at a higher speed with a lower power consumption so that they will have far better performance compared with semiconductor devices. The oxide superconductor material which has been recently advanced in study makes it possible to prepare superconducting devices which operate at relatively high temperature. Though a Josephson device is one of the most famous superconducting devices, logic circuits may be more easily assembled by using so called superconducting-base transistors or so called super-FETs (field effect transistor) which are three-terminal superconducting devices than by using Josephson devices which are two-terminal superconducting devices. Therefore, the superconducting-base transistor and the super-FET are more practical.

These superconducting devices have superconducting parts as superconducting electrodes, superconducting channels etc. These superconducting pans are usually formed of superconducting thin films.

To apply superconducting devices to various electronic equipments, these superconducting devices need to be incorporated within an IC (integrated circuit). There are many element devices on a substrate of an IC and each element device region is isolated. A superconducting thin film which has an isolated superconducting region is necessary to isolate a superconducting device region which is incorporated within IC. In case of a superconducting device formed of an oxide superconductor material which has been recently advanced in study, an oxide superconductor thin film which has an isolated superconducting region is necessary.

In the prior art, in order to isolate a superconducting region of an oxide superconductor thin film, a photoresist layer is deposited on a necessary portion of an oxide superconducting film and the deposited oxide superconductor thin film is etched back, until the exposing portion of the oxide superconductor thin film is removed at all and a surface of beneath layer exposes.

There is another conventional method in order to prepare an oxide superconductor thin film which has an isolated superconducting region, in which an oxide superconductor thin film is deposited on a substrate which has a SiO$_2$ layer where an isolation region will be formed. Si included in the SiO$_2$ layer defuses into a portion of the oxide superconductor thin film on the SiO$_2$ layer, so that the portion of the oxide superconductor thin film loses its superconductivity and changes into isolation region.

However, because of side etching etc., it is very difficult to conduct a fine processing by the etching process which uses a photoresist. In addition, a surface of an oxide superconductor thin film on which a photoresist layer is deposited will be contaminated by the photoresist. A side surface of an oxide superconductor thin film, which is exposed by etching is also contaminated by etchant. Since oxide superconducting material is easily degraded by water and Cl ion, it is difficult to prepare a superconducting device of good property with an oxide superconductor material by a process in which an oxide superconductor thin film is processed by etching.

An oxide superconductor thin film which is deposited on a substrate which has a SiO$_2$ layer on a portion of its surface is not degraded. However, a step portion is produced on the surface of this oxide superconductor thin film at the edge of the SiO$_2$ layer. In order to prepare a superconducting device, other material layers must be stacked on the oxide superconductor thin film. Because of the step portion of the surface of the oxide superconductor thin film, a stacked structure including the oxide superconductor thin film and other material layers on it is not of good quality. Therefore, it is difficult to form a multilayer structure including the oxide superconductor thin film and to form a fine structure. Further more, the problems of low withstand voltage of the step portion of the isolation region of the oxide superconductor thin film occur.

SUMMARY OF THE INVENTION

Accordingly, it is an object of the present invention to provide an oxide superconductor thin film having a planar upper surface and at least one isolated superconducting region, which have overcome the above mentioned defects of the conventional ones.

Another object of the present invention is to provide a method for manufacturing an oxide superconductor thin film which have overcome the above mentioned defects of the conventional ones.

The above and other objects of the present invention are achieved in accordance with the present invention by a superconducting thin film formed on a semiconductor substrate, comprising at least one superconducting region formed of an oxide superconductor on the principal surface of the semiconductor substrate and at least one isolation region formed of an oxide insulator including component atoms of the oxide superconductor, which surrounds the superconducting region, and the superconductor thin film having a planar upper surface.

According to another aspect of the present invention, there is provided a method of manufacturing a superconducting thin film which has a superconducting region formed of an oxide superconductor material and an isolation region which are formed on a semiconductor substrate, comprising the steps of forming a semiconductor oxide layer on a portion of a principal surface of the semiconductor substrate, on which the isolation region is arranged and a buffer layer on a portion of a principal surface of the semiconductor substrate, on which the superconducting region is arranged in such a manner that the both upper surfaces of the semiconductor oxide layer and of the buffer layer are at a same level, and growing an oxide superconductor thin film on the semiconductor oxide layer and the buffer layer.

In a preferred embodiment, the oxide superconductor is formed of a high-$T_c$ (high critical temperature) oxide superconductor, particularly, formed of a high-$T_c$ copper-oxide type compound oxide superconductor for example a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate can be formed of a semiconductor such as silicon, germanium, GaAs, InP, InGaAs, InGaAsP, etc. The semiconductor oxide layer is preferably formed of oxide of the semiconductor which constitutes the semiconductor substrate. In other words, the semiconductor oxide layer is formed by oxidizing a portion of the surface of the semiconductor substrate.

Since the superconducting thin film manufactured in accordance with the present invention has a planar upper surface, it is easy to form a multilayer structure and also a fine structure. This flat surface of the superconducting thin film also improves the withstand voltage of the isolation region.

In a preferred embodiment, the buffer layer on the semiconductor substrate can be formed of a double-layer coating formed of a $MgAl_2O_4$ layer and a $BaTiO_3$ layer if silicon is used as a substrate. This $MgAl_2O_4$ layer is formed by a CVD (chemical vapor deposition) and the $BaTiO_3$ layer is formed by a sequential sputtering process.

In the process of in accordance with the present invention, atoms included in the semiconductor oxide defuse into a portion of an oxide superconductor thin film growing on the semiconductor oxide layer, and the portion of the oxide superconductor loses its superconductivity and is converted into the isolation region formed of an oxide insulator including component atoms of the oxide superconductor. On the other hand, a crystalline oxide superconductor thin film grows on the buffer layer, which constitutes the superconducting region. Since there is no etching process by which the oxide superconductor thin film is directly processed in the method in accordance with the present invention, the oxide superconductor thin film is not contaminated and degraded.

The above and other objects, features and advantages of the present invention will be apparent from the following description of preferred embodiments of the invention with reference to the accompanying drawings.

DESCRIPTION OF THE PREFERRED EMBODIMENTS

Figure 1:
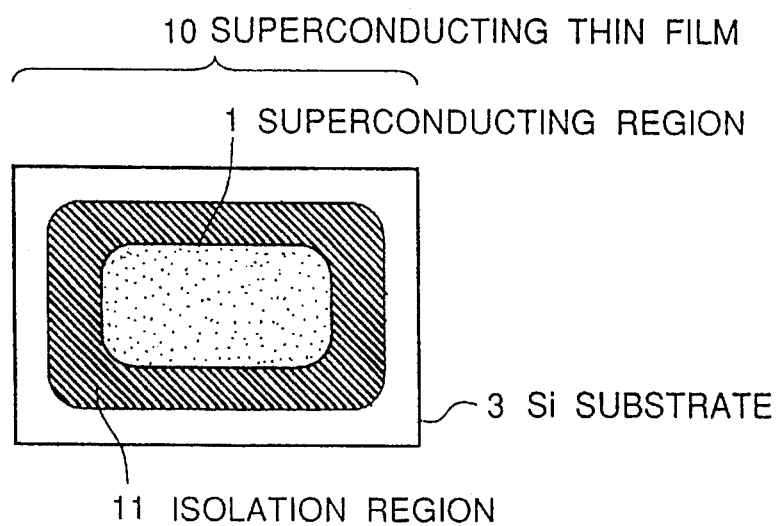
FIGS. 1 is a diagrammatic plane view of a preferred embodiment of the the superconducting thin film in accordance with the present invention.

FIG. 1 shows a diagrammatic plane view of one preferred embodiment of the superconducting thin film in accordance with the present invention. In FIG. 1, a superconducting thin film 10 includes a superconducting region 1 formed of a $Y_1Ba_2Cu_3O_{7-\delta}$ oxide superconductor material and arranged on the silicon substrate 3 and a insulation region 11 formed of a $Y_1Ba_2Cu_3O_{7-\epsilon}$ oxide insulator which includes silicon and surrounding the superconducting region 1. The superconducting thin film 10 has a planar upper surface, namely the upper surface of the superconducting region 1 and the upper surface of the isolation region 11 is at the same level.

$Y_1Ba_2Cu_3O_{7-\epsilon}$ oxide insulator which constitutes the insulating region 11 includes all the component atoms of a $Y_1Ba_2Cu_3O_{7\delta}$ oxide superconductor material, such as Y, Ba, Cu and O, and silicon as an impurity. Owing to the impurity silicon, the $Y_1Ba_2Cu_3O_{7-\epsilon}$ oxide does not have superconductivity, though its lattice structure is almost same as that of a $Y_1Ba_2Cu_3O_{7-\delta}$ oxide superconductor.

Figure 2:
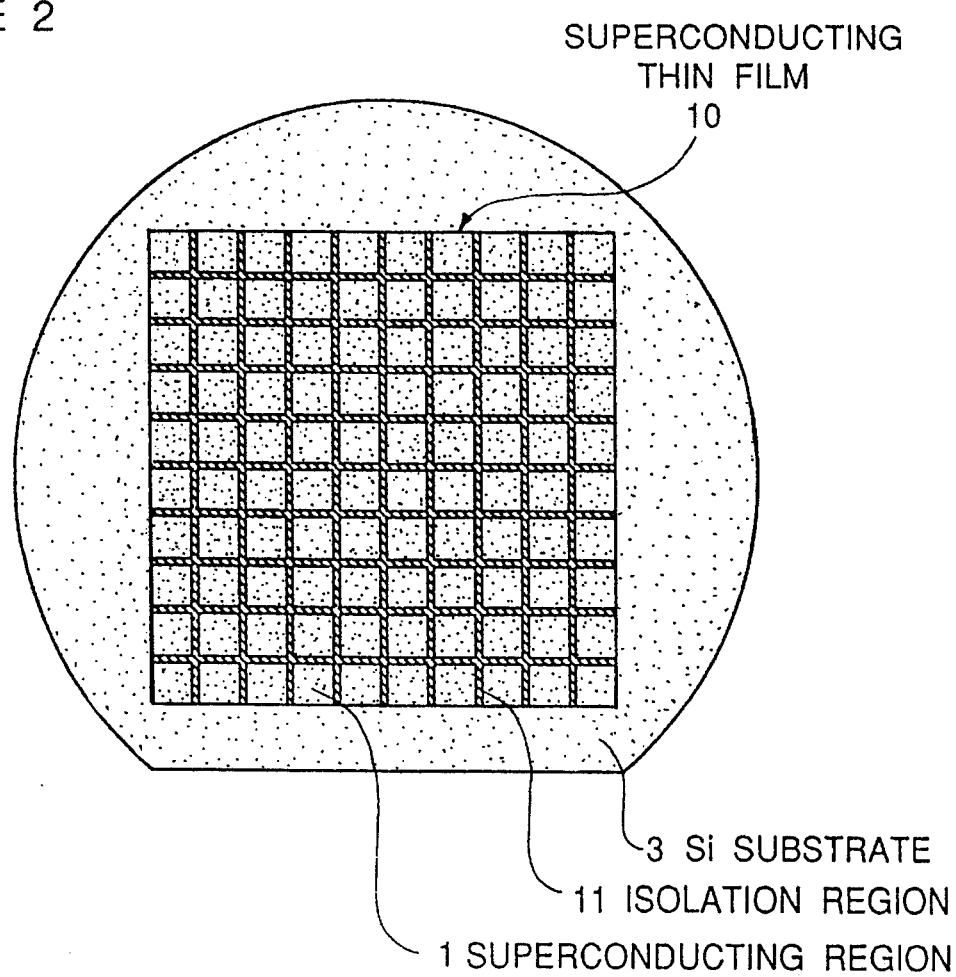
FIGS. 2 is a diagrammatic plane view of another preferred embodiment of the superconducting thin film in accordance with the present invention.

FIG. 2 shows another preferred embodiment of the superconducting thin film in accordance with the present invention, in which the superconducting thin film 10 has multiple superconducting regions 1 and isolation regions 11.

Referring to FIGS. 3A to 3G, the process in accordance with the present invention for manufacturing the superconducting thin film will be described.

Figure 3A:
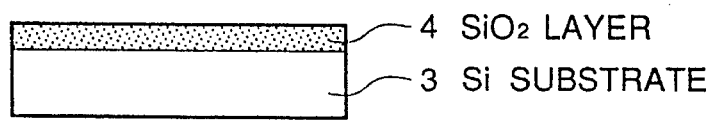
FIGS. 3A to 3G are diagrammatic sectional views for illustrating a first embodiment of the process in accordance with the present invention for manufacturing the superconducting thin film.

As shown in FIG. 3A, a $SiO_2$ layer 4 having a thickness of 450 nanometers is formed on a silicon substrate 3 by a CVD process. This substrate 3 is not limited to a silicon substrate but to any semiconductor substrate, for example germanium, GaAs, InP, InGaAs, InGaAsP, etc.

Figure 3B:
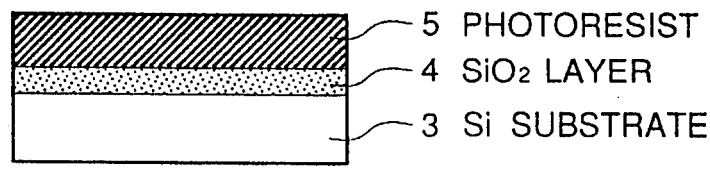
Figure 3C:
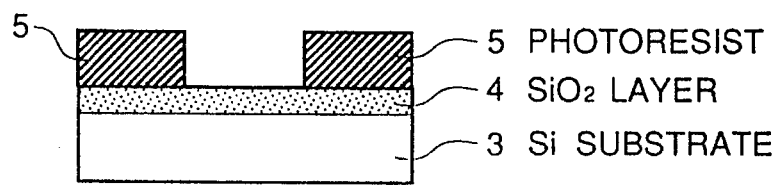
Figure 3D:
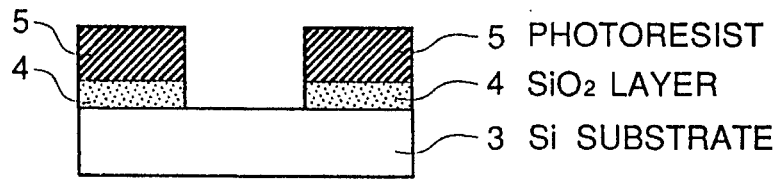

As shown in FIG. 3B, a photoresist layer 5 is deposited on the $SiO_2$ layer 4. Then, the photoresist layer 5 and also the $SiO_2$ layer 4 are patterned so that a portion of the silicon substrate 3 is exposed, on which the superconducting region will be formed, and the $SiO_2$ layer 4 remains the portion of the silicon substrate 3, on which the isolation region will be formed, as shown in FIG. 3D.

Figure 3E:
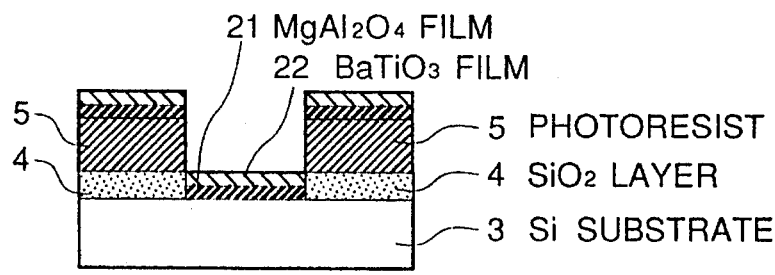

Thereafter, as shown in FIG. 3E, a buffer layer is deposited on the exposed portion of silicon substrate 3. In the case of the silicon substrate, the buffer layer is preferably formed of $MgAl_2O_4$ film 21 by a CVD (chemical vapor deposition) and of $BaTiO_3$ film 22 by a sequential sputtering process. The $MgAl_2O_4$ film 21 has a thickness of 350 nanometers and the $BaTiO_3$ film 22 has a thickness of 100 nanometers. This buffer layer formed of the double-layer has substantially the same thickness as that of the $SiO_2$ layer 4, and therefore the upper surfaces of the $SiO_2$ layer and the $BaTiO_3$ film 22 in substantially the same plane.

Figure 3F:
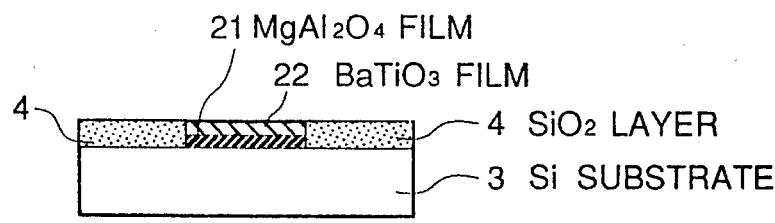
Figure 3G:
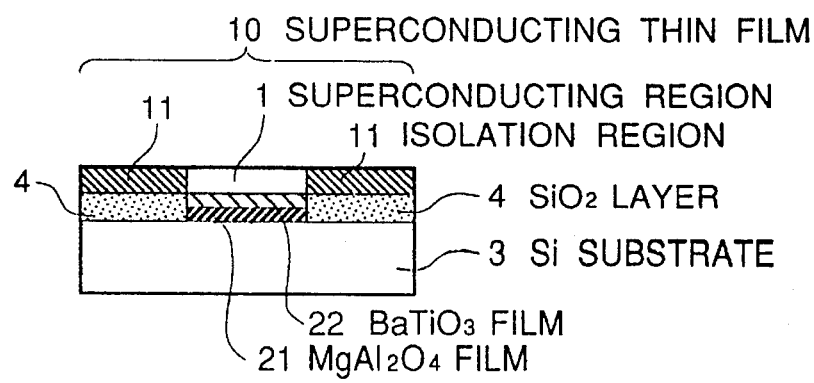

Then, as shown in FIG. 3F, the photoresist layer 5 is removed so that $SiO_2$ layer 4 is exposed. As shown in FIG. 3G, a $Y_1Ba_2Cu_3O_{7-\delta}$ oxide superconductor thin film 10 is deposited on the $SiO_2$ layer 4 and the $BaTiO_3$ film 22, by for example an off-axis sputtering, a reactive evaporation, an MBE (molecular beam epitaxy), a CVD, etc. A condition of forming the $Y_1Ba_2Cu_3O_{7-\delta}$ oxide superconductor thin film 10 by off-axis sputtering is as follows:

| | |
|---|---|
| Sputtering Gas | Ar: 90% |
| | $O_2$: 10% |
| Pressure | 10 Pa |
| Temperature of the substrate | 700–750° C. |
| Thickness | 200 nanometers |

The oxide superconductor thin film is preferably formed of a high-$T_c$ (high critical temperature) oxide superconductor material, particularly a high-$T_c$ copper-oxide type compound oxide superconductor material, for example, a Bi-Sr-Ca-Cu-O type compound oxide superconductor material, or a Tl-Ba-Ca-Cu-O type compound oxide superconductor material other than a Y-Ba-Cu-O type compound oxide superconductor material.

Silicon included $SiO_2$ layer 4 defuses into the portion of the oxide superconductor thin film 10 which is deposited on the $SiO_2$ layer 4 so that the $Y_1Ba_2Cu_3O_{7-\delta}$ oxide superconductor of the portion is converted into a $Y_1Ba_2Cu_3O_{7-\epsilon}$ oxide insulator and the isolation region 11 is formed.

The portion of the oxide superconductor thin film 10 which is deposited on the $BaTiO_3$ film 22 is formed of the c-axis orientated crystalline $Y_1Ba_2Cu_3O_{7-\delta}$ oxide superconductor. With this, the superconducting thin film in accordance with the present invention is completed.

As explained above, if the superconducting thin film is manufactured in accordance with the first embodiment of the method of the present invention, no etching process is used for processing of the oxide superconductor thin film. Therefore, the oxide superconductor thin film is not contaminated and degraded. Since the flatness of the upper surface of the superconducting thin film can be improved, it become easy to form other layers on the upper surface of the superconducting thin film in a later process. Furthermore, since the isolation region is formed of an oxide which is made of the same composition and has same crystal structure as those of the oxide superconductor constituting the superconducting region, the superconducting thin film is superior in mechanical stability. Accordingly, it is easy to manufacture the superconducting thin film with good repeatability, and the manufactured superconducting thin film has a stable performance.

Referring to FIGS. 4A to 4G a second embodiment of the process for manufacturing the superconducting film will be described.

Figure 4A:
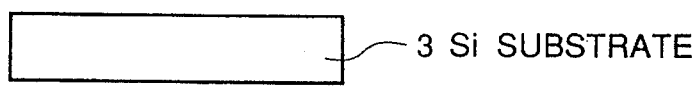
FIGS. 4A to 4G are diagrammatic sectional views for illustrating a second embodiment of the process in accordance with the present invention for manufacturing the superconducting thin film.

As shown in FIG. 4A, there is prepared a silicon substrate 3, similar to the substrate 3 shown in FIG. 3A.

Figure 4B:
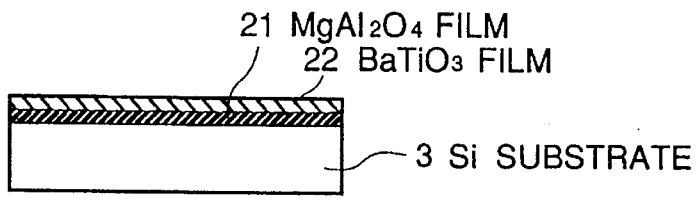

As shown in FIG. 4B, a buffer layer is deposited on the exposed portion of silicon substrate 3. In the case of the silicon substrate, the buffer layer is preferably formed of $MgAl_2O_4$ film 21 by a CVD (chemical vapor deposition) and of $BaTiO_3$ film 22 by a sequential sputtering process. The $MgAl_2O_4$ film 21 has a thickness of 350 nanometers and the $BaTiO_3$ film 22 has a thickness of 75 nanometers.

Figure 4C:
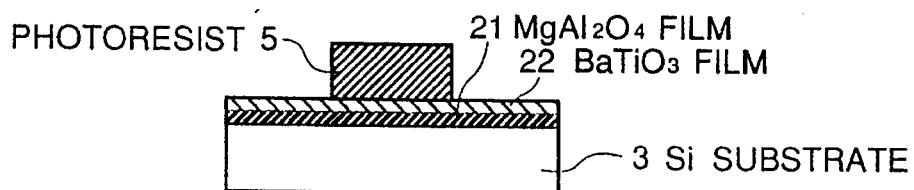
Figure 4D:
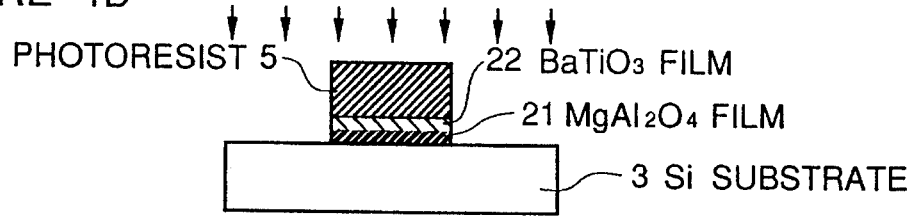

Then, as shown in FIG. 4C, a photoresist layer 5 is deposited on a portion of the $BaTiO_3$ film 22, on which the superconducting region will be formed. Thereafter, as shown in FIG. 4D, a portion of the $BaTiO_3$ film 22 and the $MgAl_2O_4$ film 21 which is not coated with photoresist 5 is removed by a reactive ion etching process or an ion milling using Ar-ions, so that the portion of silicon substrate 3 is exposed. It is not a problem that the portion of the silicon substrate is etched slightly.

Figure 4E:
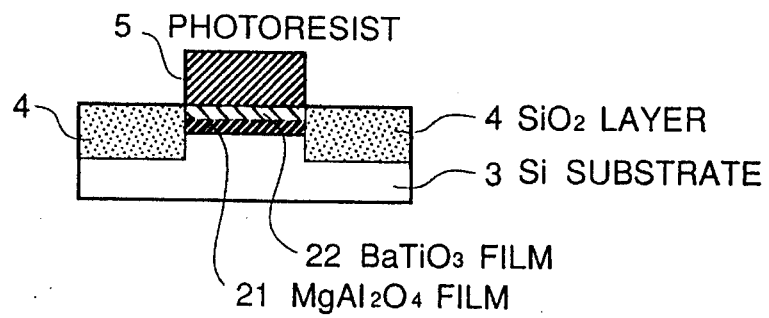

Then, as shown in FIG. 4E, the portion of silicon substrate 3 exposed is oxidized by the water vapor so that a $SiO_2$ layer 4 which has a upper surface level with that of the $BaTiO_3$ film 22 is formed. If necessary, the silicon substrate 3 is etched before the oxidation, so that no step is generate between the upper surface of the $SiO_2$ layer 4 and that of the $BaTiO_3$ film 22.

Figure 4F:
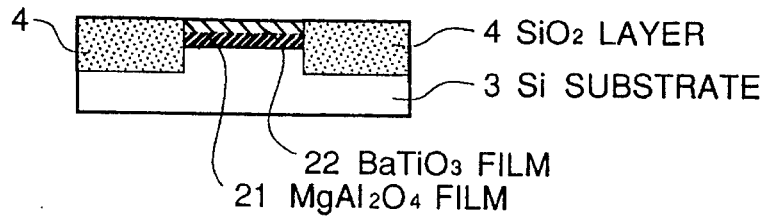
Figure 4G:
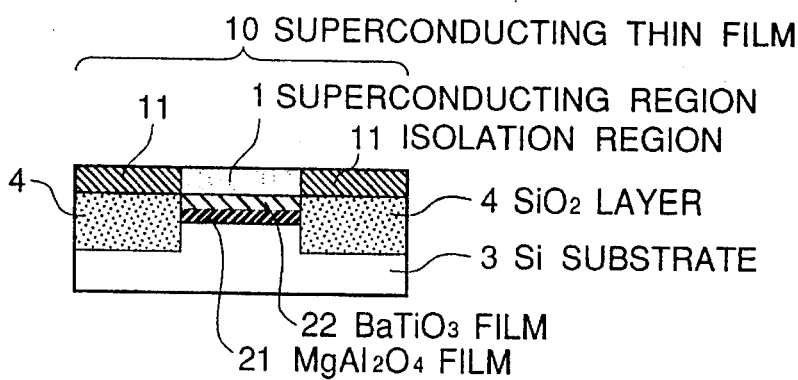

After that, as shown in FIG. 4F, the photoresist 5 is removed so that the $BaTiO_3$ film 22 is exposed. The exposed surface of the $BaTiO_3$ film 22 is cleaned by pre-sputtering. Then, as shown in FIG. 4G, a $Y_1Ba_2Cu_3O_{7-\delta}$ oxide superconductor thin film 10 is deposited on the $SiO_2$ layer 4 and the $BaTiO_3$ film 22, by for example an off-axis sputtering, a reactive evaporation, an MBE (molecular beam epitaxy), a CVD, etc. A condition of forming the $Y_1Ba_2Cu_3O_{7-\delta}$ oxide superconductor thin film 10 by off-axis sputtering is as follows:

| | |
|---|---|
| Sputtering Gas | Ar: 90% |
| | $O_2$: 10% |
| Pressure | 10 Pa |
| Temperature of the substrate | 700–750° C. |
| Thickness | 200 nanometers |

The oxide superconductor thin film is preferably formed of a high-$T_c$ (high critical temperature) oxide superconductor material, particularly a high-$T_c$ copper-oxide type compound oxide superconductor material, for example, a Bi-Sr-Ca-Cu-O type compound oxide superconductor material, or a Tl-Ba-Ca-Cu-O type compound oxide superconductor material other than a Y-Ba-Cu-O type compound oxide superconductor material.

Silicon included $SiO_2$ layer 4 defuses into the portion of the oxide superconductor thin film 10 which is deposited on the $SiO_2$ layer 4 so that the $Y_1Ba_2Cu_3O_{7-\delta}$ oxide superconductor of the portion is converted into a $Y_1Ba_2Cu_3O_{7-\epsilon}$ oxide insulator and the isolation region 11 is formed.

The portion of the oxide superconductor thin film 10 which is deposited on the $BaTiO_3$ film 22 is formed of the c-axis orientated crystalline $Y_1Ba_2Cu_3O_{7-\delta}$ oxide superconductor. With this, the superconducting thin film in accordance with the present invention is completed.

As explained above, if the superconducting thin film is manufactured in accordance with the second embodiment of the method of the present invention, no etching process is used for processing of the oxide superconductor thin film. Therefore, the oxide superconductor thin film is not contaminated and degraded. Since the flatness of the upper surface of the superconducting thin film can be improved, it becomes easy to form other layers on the upper surface of the superconducting thin film in a later process. Furthermore, since the isolation region is formed of an oxide which is made of the same composition and has same crystal structure as those of the oxide superconductor constituting the superconducting region, the superconducting thin film is superior in mechanical stability. Accordingly, it is easy to manufacture the superconducting thin film with good repeatability, and the manufactured superconducting thin film has a stable performance.

The invention has thus been shown and described with reference to the specific embodiments. However, it should be noted that the present invention is in no way limited to the details of the illustrated structures but converts and modifications may be made within the scope of the appended claims.

We claim:

1. A superconducting thin film structure formable on a semiconductor substrate which has a principal surface, said thin film structure comprising:

a buffer layer structure formed on said principal surface of said semiconductor substrate, said buffer layer structure having a planar upper surface located above said principal surface in a direction perpendicular to said principal surface, said buffer layer structure including a first thin film deposited directly on said principal surface of said substrate, and a second thin film deposited directly on said first film, said substrate being a silicon substrate and said first thin film of said buffer layer structure being a $MgAl_2O_4$ film and said second thin film thereof being a $BaTiO_3$ film;

an insulator layer which abuts at least an edge of said buffer layer structure, said insulator layer having a planar upper surface located above said principal surface, in said direction, each of said planar upper surface of said buffer layer structure and said planar upper surface of said insulator layer being in the same plane; and a superconductive thin film layer, said thin film layer having a uniform thickness in said direction and a portion located on said buffer layer structure and a portion located on said insulator layer, said thin film layer thereby having a planar upper surface defined by said portion thereof located on said buffer layer structure and said portion thereof located on said insulator layer, said superconducting layer being formed of one of a Y-Ba-Cu-O compound oxide superconductor material, a Bi-Sr-Ca-Cu-O compound oxide superconductor material, and a Tl-Ba-Ca-Cu-O compound oxide superconductor material, said thin film layer having, at least one superconducting region formed by said portion formed on said buffer layer structure on said principal surface of said semiconductor substrate, and at least one isolation region formed by said portion formed on said insulator layer, said superconducting thin film of said isolation region including constituent atoms from said insulator layer whereby said thin film of said isolation region surrounds said superconducting region;

said buffer layer being formed of a material which prevents constituent atoms of said insulator layer from defusing into said superconductive thin film layer and on which can be grown a crystalline oxide superconductive thin film layer formed of one of a Y-Ba-Cu-O compound oxide superconductor material, a Bi-Sr-Ca-Cu-O compound oxide superconductor material, and a Tl-Ba-Ca-Cu-O compound oxide superconductor material.

2. A superconducting thin film structure claimed in claim 1 wherein the superconducting thin film comprises multiple isolated superconducting regions and multiple isolation regions.

3. A superconducting thin film claimed in claim 1 wherein said insulator layer is a semiconductor oxide layer.

4. A superconducting thin film claimed in claim 1 wherein the substrate is formed of a silicon substrate, germanium substrate, GaAs substrate, InP substrate, InGaAs substrate or InGaAsP substrate.

5. A superconducting thin film structure as claimed in claim 1, wherein said insulator layer surrounds said buffer layer structure by abutting all side edges thereof, whereby said isolation region surrounds said superconducting region by abutting all side edges thereof.

6. A superconducting thin film structure as claimed in claim 5, wherein said thin film structure comprises a plurality of superconducting regions surrounded by said isolation regions.

7. A superconducting thin film structure claimed in claim 1 wherein said superconductive thin film layer has a thickness of 200 nanometers in said direction.

8. A superconducting thin film structure claimed in claim 1 wherein said insulator layer has a thickness which is thicker than said superconductive thin film layer.

9. A superconducting thin film structure claimed in claim 8 wherein said insulator layer has a thickness of 250 nanometers in said direction.

10. A superconducting thin film structure claimed in claim 1, wherein, in said direction, said superconductive thin film layer has a thickness of about 200 nanometers, and said insulator layer has a thickness of about 250 nanometers.

* * * * *